United States Patent [19]

Warner

[11] 3,950,630

[45] Apr. 13, 1976

[54] COMMUTATOR TERMINAL MACHINE AND METHOD

[76] Inventor: Allan S. Warner, 50 Haliday St., Clark, N.J. 07066

[22] Filed: Mar. 22, 1974

[21] Appl. No.: 453,869

[52] U.S. Cl. .................... 219/91; 219/80; 219/87; 219/109
[51] Int. Cl.² ........................................ B23K 11/10
[58] Field of Search ............ 219/78, 79, 80, 87, 91, 219/109

[56] References Cited
UNITED STATES PATENTS

| | | | |
|---|---|---|---|
| 2,577,163 | 12/1951 | Spittler et al. ........................ | 219/91 |
| 3,045,103 | 7/1962 | Warner .................................. | 219/78 |
| 3,515,842 | 6/1970 | Niemeyer et al. ................... | 219/109 |
| 3,553,418 | 1/1971 | Garver et al. ........................ | 219/79 |
| 3,781,981 | 1/1974 | Miura et al. ......................... | 219/87 X |

*Primary Examiner*—J. V. Truhe
*Assistant Examiner*—N. D. Herkamp

[57] ABSTRACT

A machine and method terminating armature windings to commutators having means for testing the integrity of the connection and winding between two commutator segments immediately after each termination is bonded and recycling the bonding sequence at the same or different bonding energy if certain faults are detected. If the tests indicate certain faults or retests are negative, the armature is ejected without making further termination.

14 Claims, 3 Drawing Figures

COMMUTATOR TERMINAL MACHINE AND METHOD

BACKGROUND

The present invention relates to an apparatus and method for making motor armatures and more particularly to a new and improved apparatus for automatically testing each armature winding and its connection to the associated commutator bar and for controlling the fusing or welding machine making the winding-commutator connections according to the test response.

In an electric motor manufacturing process, armatures are produced by a coil winding machine that automatically winds the coil about the armature in a predetermined pattern. The ends or loops of the coil are temporarily connected to the assigned commutator segments (tang or slot) on the armature shaft by the winding machine, by hand or by a supplemental lead connecting machine. To finalize the connection the machine welds or fuses the tang or slot and wire assembly.

Although other tests may be made during welding on known machines (such as welding current measurements), it is standard to complete all bonded connections to the commutators after which the armature is removed for quality testing. This is accomplished by an operator manually placing the armature in an automatic or semi-automatic armature testing device. If a bad connection or open or shorted winding is indicated, the armature is repaired, if possible, or scrapped.

This conventional procedure results in an excessive waste of capital equipment time, operator time and electrical energy. This can be seen in those instances where the machine makes a bad connection or some other problem exists with one of the early windings welded or fused to the commutators. In such case, present practice is, nevertheless, to complete all remaining connections since testing is done at a subsequent station. Furthermore, while a defective armature is being tested, the machines may be incorporating the same defect into other armatures in process of being made.

SUMMARY

The present invention avoids the foregoing technical problems and provides other and further benefits and advantages.

Briefly, an armature commutator fusing or welding machine according to the invention comprises the usual welding or fusing electrodes movable to engage a predetermined commutator segment to make the winding connection. After the connection is bonded, the bonding and ground electrodes remain in place and a test probe contacts the preceding commutator segment associated with the winding just connected to complete the current path through that winding to the last welded segment. A test control circuit places a test signal across the probe and last welded segment, the characteristics of which depend upon the integrity of the bonded connections and the condition of the winding under test.

A sensing and logic circuit reads the pulse and can control the machine to lift the probe and to recycle the bonding electrode with the same or higher bonding energy, if necessary. This cycle is followed by a retest. If the retest is negative, the armature can be ejected without making further commutator terminations or an alarm can be sounded and the machine shut down until properly adjusted.

DETAILED DESCRIPTION

Other advantages will become apparent with the following detailed description when taken in view of the appended drawings in which.

The present invention will be described, by way of example, as a tang-type commutator fusing machine, however, it will be understood that the invention can comprise a stake-type or welding type machine also. One such fusing machine is disclosed in U.S. Pat. No. 3,045,103 incorporated herein by reference.

Figure 1:
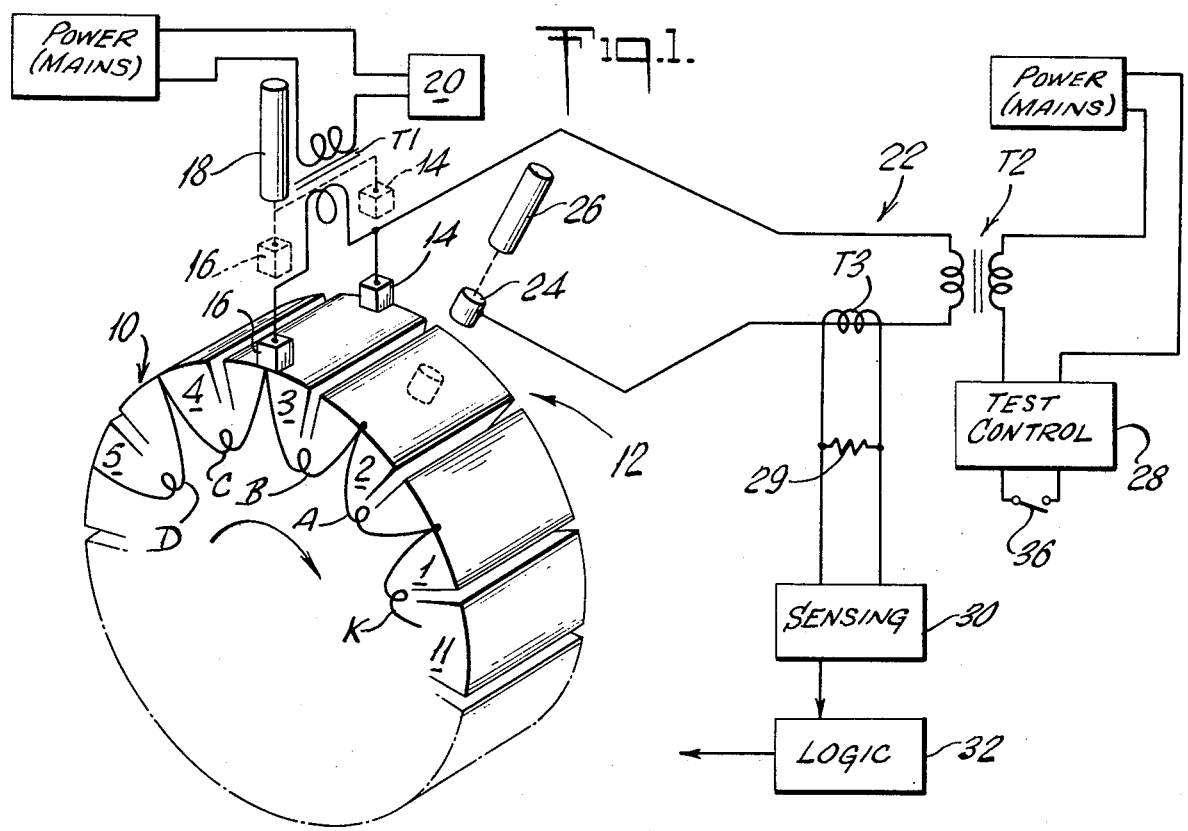
FIG. 1 is a schematic diagram of a portion of a motor commutator ring and winding-commutator bonding machine according to the invention.
Figure 2:
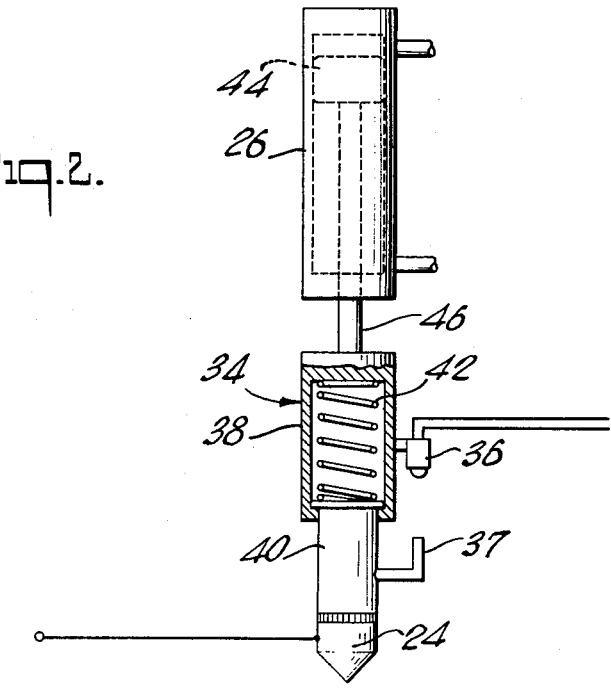
FIG. 2 is a diagramatic representation of one example of a test probe that can be used in the machine of FIG. 1.

With reference to FIG. 1 and 2, motor 10, in this example, has eleven commutator segments wound thereon with adjacent winding ends to be connected to a common commutator segment under its associate tang (not shown but represented when fused by the enlarged dot). The fusing machine generally indicated as 12 includes a ground electrode 14 and a fusing electrode 16 movable by air cylinder 18 into and out of (solid and phantom lines) engagement with the segment and tang-winding assembly at the fusing station. After each fusing and testing operation, the motor armature is automatically turned by an index mechanism (not shown) to bring the next commutator winding and tang assembly to the fusing station in line with the fusing electrode. Transformer T1 couples the fusing current and timing control circuit 20 to electrodes 14 and 16. For further understanding of the structural details and operation of fusing machine 10, see U.S. Pat. No. 3,045,103.

According to the invention, machine 12 includes a test apparatus 22 comprising a test probe 24 movable by air cylinder 26 into and out of engagement with the commutator associated with the winding connected to the commutator in the fusing station. In this example, the windings are connected to adjacent commutators, however, it is understood that, depending on the predetermined winding pattern and number of commutators, each winding may be electrically and physically connected between non-adjacent commutators.

Transformer T2 has its primary coupled to test control circuit 28 and its secondary connected across probe 24 and electrode 14. Control circuit 28 operates when probe 24 makes predetermined pressure contact (to avoid contact resistance) with a commutator to apply a current pulse of predetermined amplitude and duration on transformer T2 as further described below. A current transformer T3 such as a toroidal type picks up the pulse on the secondary of T2 and applies it to shunt resistance 29 and the input of a suitable sensing circuit 30 which may be a conventional current meter relay or the like. Circuit 30 controls a logic circuit 32 that in turn controls cylinders 18 and 26 and control circuit 20. Examples of a standard commercially available sensing circuit 30 and logic circuit 32, which can be readily modified to perform the required function, are monitor model J.D.W. and commutator fuser model 71C.T. available from Joyal Products, Incorporated, Linden, N.J.

Referring to FIG. 2, probe assembly 34 may include a sleeve 38 receiving the end of rod 40 the opposite end of which includes probe 24. Spring 42 normally urges sleeve 38 and rod 40 apart. Air cylinder 26 includes a piston 44 with a piston rod 46 coupling the same to sleeve 38. Upon operation of cylinder 26, piston 44 is advanced. Probe 24 stops upon engaging the commutator segment and sleeve 38 continues to follow on against pressure of spring 42. When predetermined pressure is applied to probe 24 switch contacts of microswitch 36 close against stop to operate test control circuit 28.

Figure 3:
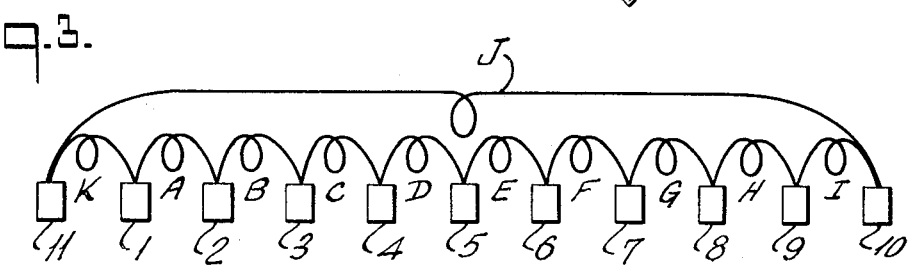
FIG. 3 is a schematic diagram of the commutators and windings of an eleven commutator motor.

Referring to FIGS. 1 and 3, in operation, assuming fusing machine 12 receives a wound armature, the ends of coils K and A are positioned for connection to commutator segment 1. Electrodes 14 and 16 and circuit 20 are operated to fuse the tang and wire assembly by application of heat, current and pressure as described in U.S. Pat. No. 3,045,103. Both electrodes 14 and 16 are withdrawn. Test apparatus 22 makes no test on this first connection.

The armature is then indexed to the next commutator segment, and coils A and B are positioned for connection to commutator segment 2. Electrodes 16 and 14 again make the bonded connection with electrodes 16 and 14 remaining in place and no current in T1, probe 24 is moved into engagement with commutator segment 1. A closed circuit is made from the secondary of transformer T2 through electrode 14 on segment 2, coil A and probe 24 on segment 1. Switch 36 closes to control test control circuit 28 that places a predetermined test signal on T2. The current amplitude of the test signal is any suitable level that matches the wire rating under test. One example is one-half cycle of the 60 cycle mains pulse with an amplitude substantially the same as the mains amplitude. Alternate polarity half cycles can be used on successive tests to avoid saturation of transformer T2. The signal picked up by T3 and read by sensing circuit 30 has characteristics corresponding to the quality of the coil and the fused connections of coil A to commutator segments 1 and 2. For example, if sensing circuit 30 detects a current lower than a predetermined standard this could mean that there is a badly fused connection or that there is an open resulting from:

a. no fused connection
b. a broken coil
c. a wire not properly positioned relative to the tang or slot.
d. a wire damaged during winding or other processing. A higher than standard current reading could mean a possible short in coil A, defective insulation thereon or a foreign substance causing a reduced resistance somewhere in the circuit.

In the case of lower current, logic circuit 32 controls the withdrawal of probe 24 and recycling and energization of circuit 20 to refuse the connection on segment 2. If desired, the refusing current density can be made higher, lower or the same as the normal density. A retest is made in the same manner as aforementioned and if affirmative the armature is indexed to the next segment and the fusing and testing cycle repeated. If the retest is negative, the machine stops and rejects the armature.

In the event of sensing a high current, the armature can be rejected or reactivation of electrode 16 can be controlled similiar to that as stated in the case of sensing a low current in an attempt to burn away the aforementioned foreign substance.

Of course, if the initial test is affirmative (sensed current in satisfactory range), logic circuit 32 controls withdrawal of probe 24 and electrodes 14 and 16 and indexing the armature to the next segment.

So long as no faults are detected, the fusing-testing sequence is repeated for each of the remaining coils and segments. After connections to segment 11 are fused, the index mechanism moves segment 1 to the fusing station. Electrodes 14 and 16 move to contact segment 1 but no fusing current is applied. Probe 24 contacts segment 11 to test on coil K. It can be seen then that each segment connection had been tested twice by apparatus 22 once under pressure and again with no pressure. For example, the connection on segment 1 was tested as part of the circuit when coil A was tested, and again as part of the circuit when coil K was tested. Thus, if the fused connection tests good on the first test but deteriorates thereafter upon further cooling or removal of pressure, this can be detected by the second test. However, from a probability standpoint, if a low current is sensed, it is much more likely to be a result of the most recent connection made and not the one previous to that.

In addition to the foregoing advantages, automatic counters can be employed to determine the reject rate of each fusing machine, which counters upon reaching a predetermined count, would sound an alarm for operator inspection and maintenance on the machine.

Other and further modifications and additions can be made to the present invention without departing from the spirit and scope thereof.

I claim:

1. A machine for terminating armature winding to commutator segments comprising first means for successively bonding winding portions to associated commutator segments and second means for testing the quality of the connections and winding electrically between each associated pair of segments after the latter segment is bonded but before any further segment is bonded and third means for controlling recycling of said first means to rebond the last bonded segment in response to the second means indicating a predetermined type of fault.

2. A machine according to claim 1 wherein said second means is adapted to retest the quality after a segment has been rebonded and before further bonding, and said third means is adapted to stop further bonding in response to the second means indicating a fault after a retest.

3. A machine for terminating armature coil portions to a plurality of commutator segments on the armature comprising a frame, first means arranged at a station relative to said frame for bonding coil portions to associated commutator segments moved to said station, testing means for applying a test signal across an electric circuit that includes the segment in the station after the coil portion has been bonded thereto and a predetermined previously bonded segment that is electrically connected to the segment in the station through an armature coil winding such that predetermined characteristics of the test signal correspond with predetermined characteristics of said electric circuit, and second means to sense the test signal and to control the machine in response to whether the signal characteristics fall above or below at least one predetermined value.

4. A machine as set forth in claim 3 wherein said test means comprise a test control circuit operable to produce a predetermined signal having predetermined characteristics, means for coupling said predetermined signal to said electric circuit.

5. A machine as set forth in claim 4 wherein said electric circuit includes a probe means movable to engage said predetermined previously bonded segment, said probe menas carrying normally spaced switch contacts that close upon application of a predetermined pressure between the probe means and segment to control activation of said test control circuit.

6. A machine as set forth in claim 4 wherein first means includes a grounding electrode and a bonding electrode independantly movable relative to said frame to engage a segment in the station, said electric circuit including said grounding electrode and a probe means movable to engage said previously bonded segment.

7. A machine as set forth in claim 4 wherein said means for coupling includes a transformer having its primary coupled to the test control circuit and its secondary coupled to said electric circuit, and said second means includes means coupled to the secondary of the transformer for picking up a signal corresponding to the test signal.

8. A machine as set forth in claim 3 wherein said second means comprises a logic circuit for controlling the machine operations and a sensing circuit for receiving the signal corresponding to the test signal and for applying a control signal to the logic circuit in response thereto.

9. A machine as set forth in claim 8 wherein the logic circuit is adapted (a) to cause said first means to recycle to rebond the segment in the station in response to a signal indicative of an unacceptable high resistance in said electric circuit, and (b) after said rebonding to cause said test means to recycle.

10. A method of making armatures including coil and commutator segment terminations comprising bonding an associated coil portion to a first segment; bonding an associated coil portion to a second segment electrically coupled to the first segment by an armature winding; before further bonding, testing the quality of the circuit that includes the first and second segment and their associated winding; if the quality test is satisfactory, bonding a coil portion to a third segment that is electrically coupled to the second segment; before further bonding, testing the quality of the circuit that includes the second and third segments and their associated winding; and so long as the tested quality is satisfactory, continuing these steps until all segments are bonded.

11. The method according to claim 10 wherein following each of said tests that indicate a circuit resistance higher than a predetermined value, rebonding the last bonded coil portion segment before further bonding, retesting the quality of the last tested circuit and if the retest is satisfactory, continuing the method as if the initial test was satisfactory.

12. The method according to claim 11 wherein said rebonding is at a different predetermined bonding energy than the predetermined energy used in the initial bonding of the segment.

13. The method according to claim 11 wherein following a negative retest, discontinuing the bonding of the armature.

14. The method according to claim 11 wherein following a test that indicates a lower circuit resistance than a predetermined value discontinuing the bonding of the armature.

* * * * *